United States Patent [19]

Hermann et al.

[11] Patent Number: 5,084,439

[45] Date of Patent: Jan. 28, 1992

[54] MELTABLE HIGH TEMPERATURE TB-R-BA-CU-O SUPERCONDUCTOR

[75] Inventors: Allen M. Hermann; Zhengzhi Sheng, both of Fayetteville, Ark.

[73] Assignee: The University of Arkansas, Little Rock, Ark.

[21] Appl. No.: 330,921

[22] Filed: Mar. 17, 1989

Related U.S. Application Data

[63] Continuation of Ser. No. 82,222, Aug. 6, 1987, abandoned.

[51] Int. Cl.$^5$ .......................... C01F 17/00; C01G 3/02
[52] U.S. Cl. ........................................ 505/1; 252/518; 252/521; 423/604; 423/635; 501/123; 501/152; 505/725; 505/779
[58] Field of Search ................ 501/123, 152; 502/346; 423/604, 635; 505/1, 779, 725; 252/518, 521

[56] References Cited

U.S. PATENT DOCUMENTS 4,857,504 8/1989 Hermann et al. ...................... 505/1

OTHER PUBLICATIONS

Murphy, "New Superconducting Caprote Perovskites" *Phys. Rev. Lett.* vol. 58, No. 18, May 4, 1987, pp. 1888–1890.
Oota, "Electrical, Magnetic and Superconducting (Y,Sc)-(Ba,Sr)-Cu", *Jap. Jnl. of Appl. Phys.* vol. 26, No. 8, Aug. 1987, pp. L1356–L1358.
Qadri, "X-Ray Identification of the Superconducting in Y-Ba-Cu-O System" *Phys. Review B,* vol. 35, No. 13, May. 1, 1987, pp. 7235–7237.
Iwazumi, "Identification of a Structure with Two Super..." *Jap. Jnl. Appl. Phys.,* vol. 26, No. 5, May 1987, pp. L621–L623.
Ishida, "Compositional Variation of High Tc in $Yb_xEr_{l-x}Ba_2Cu_3O_{6xy}$...", *Jap. Jnl. Appl. Phys.* vol. 26, No. 8, Aug. 1987, pp. L1294–L1295.
Bourne, "Compositionally Dependent Superconducting Trans. Temp...." *Physics Lett. A,* vol. 123, No. 1, Jul. 13, 1987, pp. 34–36.
Hosoya, "High-Tc Superconductivity in New Oxide Systems II" *Jpn. Jnl. Appl. Phys.,* vol. 26, No. 4, Apr. 1987, pp. L456–L457.
Hasegawa, "High Tc Superconductivity of $(La_{l-x}Sr_x)_2Cu O_y$—..." *Jap. Jnl. Appl. Physics,* vol. 26(4), Apr. 1987, pp. L337–338.
Capone, "Upper Critical Fields and High Superconducting..." *Appl. Phys. Lett.* 50(9), Mar. 2, 1987, pp. 543–544.
Johnson, "Fabrication of Ceramic Arricles from High Tc..." *Ex. Abst: High Temp. Supercond.* Apr. 23–24, 1987 MRS, pp. 193–195.
Cava, "Bulk Superconductivity at 91K in Single-Phase Oxygen"... *Physical Review Lett.* vol. 58 No. 16, Apr. 20, 1987, pp. 1676–1679.
Kishio, K. et al., "Effect of Lanthanide Ion Substitutions... On Superconductivity of $(La_{l-x}Sr_x)_2CuO_{y-d}$", *Jpn. J. Appl. Phys.,* 26, No. 4, Apr. 20, 1987, L391–L393.
Ohshima, S. et al.: "Superconducting. . . $Ba_{l-x}Ln_x$-$CuO_{3-y}$... System", *Jpn. J. Appl. Phys.,* 36, No. 5, May 20, 1987, L815–L817.
Tsurumi, S. et al.: "High Tc Superconductivities of $A_2Ba_4Cu_6O_{14}$", *Jpn. J. Appl. Phys.,* 26, No. 5, L856–L857.
*Superconductivity News,* vol. 1, No. 2, Aug. 1987, pp. 1, 2, & 6–8.
K. N. Yang, High Temperature Superconductivity in Rare Earth (R)-Barium Copper Oxides $(RBa_2)$-$Cu_3O_{9-67}$, Solid State Communications, vol. 63, No. 6, pp. 515–519, (1987).
J. M. Tarascon, Oxygen and Rare-Earth Doping of the 90-K Superconducting Perovskite $YBa_2Cu_3O_{7-x}$, The American Physical Society, 1987, vol. 36, No. 1.
P. H. Hor, Superconductivity Above 90 K in the Square-Planar Compound System $ABa_2Cu_3O_{6+x}$ with A=Y, La, Nd, Sm, Eu, Gd, Ho, Er, and Lu, The American Physical Society, 1987, vol. 58, No. 18.
A. Khurana, Superconductivity Seen Above the Boiling Point of Nitrogen, Physics Today, Apr. 1987.

*Primary Examiner*—Paul Lieberman
*Assistant Examiner*—John Boyd
*Attorney, Agent, or Firm*—Hermann Ivester

[57] ABSTRACT

A high temperature superconductor is provided having meltability. The superconductor has a preferred composition of Tb-R-Ba-Cu-O wherein R is chosen from the group of rare earth metals excluding: Praseudyium; Cerium; and Terbium.

26 Claims, 1 Drawing Sheet

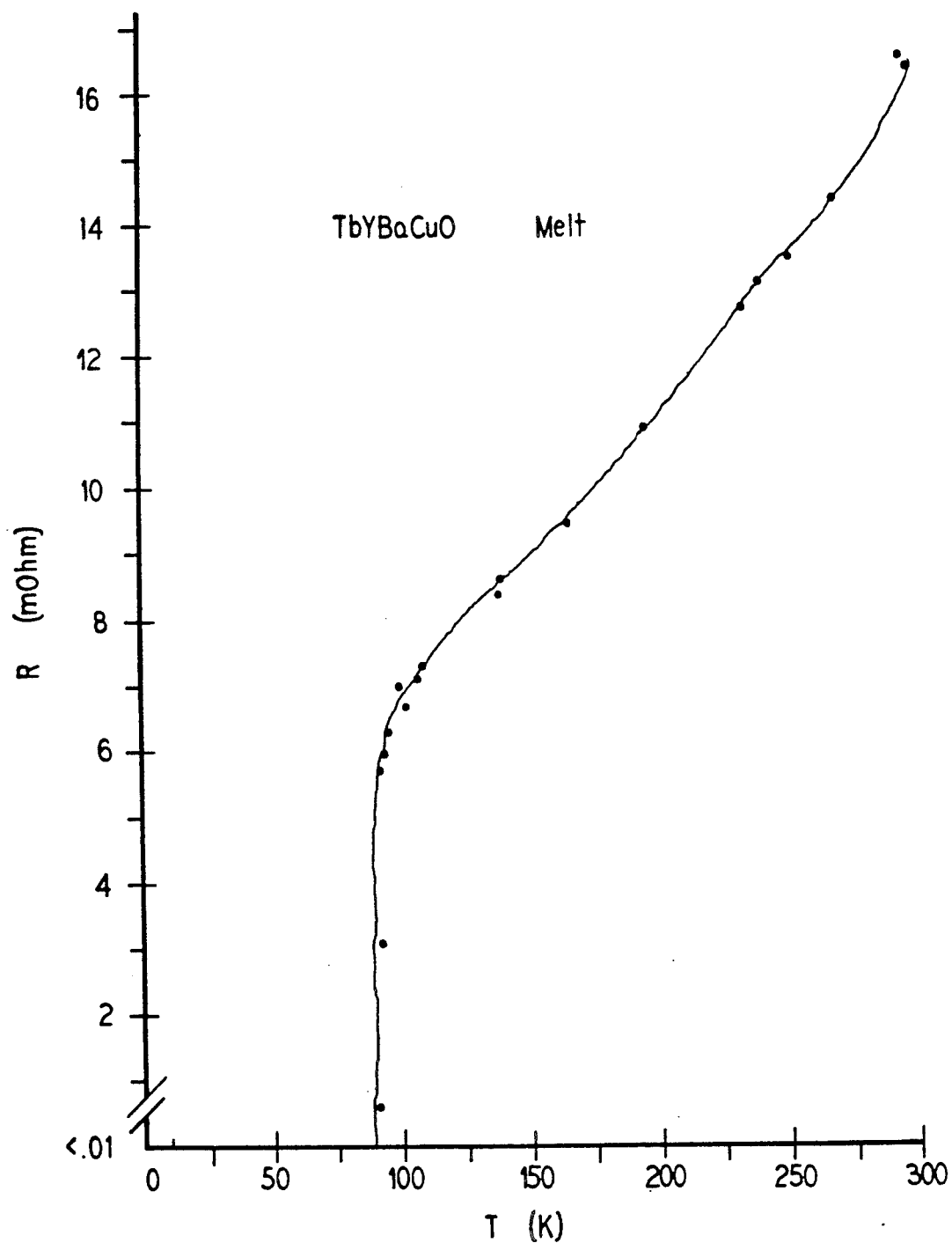

MELTABLE HIGH TEMPERATURE TB-R-BA-CU-O SUPERCONDUCTOR

This is a continuation of application Ser. No. 082,222, filed Aug. 6, 1987, now abandoned.

BACKGROUND OF THE INVENTION

The present invention relates generally to high temperature superconductors. More specifically, the present invention relates to a meltable, high temperature superconductor.

Recently, there has been much work done on the utilization of ternary oxides containing rare earth elements for superconductivity at temperatures above 90° K. with the belief that superconductivity at or above room temperature is possible. Some of this work has centered on the utilization of a yttrium (Y)-barium (Ba)-copper (Cu)-oxygen (0) system.

Current developments of the Y-Ba-Cu-0 class of ceramic superconductors have yielded optimistic results. These systems are typically created utilizing bulk materials which are powders or very small granule substances. These powders must be compressed to facilitate measurements and are relatively intractable. As can be appreciated, the structure of these substances is not conducive to the manufacturing of components from these ceramic superconductors. Although a meltable, high temperature superconductor would be desirable, heretofore, these ceramic superconductor systems have not provided a meltable high temperature superconductor composition. Indeed, it has been reported that melting of the composition typically utilized for high temperature superconductivity appears to quench superconductivity in these compounds.

A meltable, high temperature superconductor composition would be desirable for many reasons. Meltability would: (1) allow the growth of large bulk single crystals--this is important because it could facilitate the discovery of the correct theory on superconductivity; (2) provide low cost processing and manufacturability in a field where only bulk processing by compressing powders is presently available; (3) allow the addition of other components to the melted high temperature superconductor—this would allow one to create an extrudeable composition allowing the superconductor to be useful in the manufacture of superconducting wires, magnets, etc.; and (4) the inventors believe, allow for high critical currents in the high temperature superconductor allowing the generation of large currents therethrough.

Accordingly, there is a need for a meltable high temperature superconductor composition.

SUMMARY OF THE INVENTION

The present invention provides a high temperature superconductor composition having meltability that is unique to date among high temperature superconductors.

The present invention preferably comprises a composition having the following formula:

Tb-R-Ba-Cu-O wherein:

R is chosen from the group of rare earth metals excluding: Praseodymium (Pr); Cerium (Ce); and Terbium (Tb).

Preferably, R is chosen from the group of rare earth metals that include: Yttrium (Y); Gadolinium (Gd); Erbium (Er); Holmium (Ho); Neodymium (Nd); Samarium (Sm); Europium (Eu); Ytterbium (Yb); Dysprosium (Dy); Thulium (Tm); and Lutetium (Lu).

In a preferred embodiment, the meltable superconductor has the following approximate stoichiometry:

$$Tb_xR_yBa_vCu_3O_{6.5+z}$$

wherein:

R is a rare earth metal not including: Pr; Tb; or Ce;

V is greater than or equal to 2 and less than or equal to 2.6;

X is less than 0.8 and greater than 0.01;

Y is less than 1.8 and greater than 0.8; and

Z is greater than or equal to 1.1 but less than or equal to 1.7.

A method of producing a meltable, high temperature superconductor is also provided. The method allows melting to be carried out at a temperature of approximately 920–960° C. in flowing oxygen. The method further allows the components of the superconductor to be melted together either as pellets, powders, or pellets and powders.

Accordingly, an advantage of the present invention is to provide a meltable, high temperature superconductor.

A further advantage of the present invention is to provide a high temperature superconductor that affords the ability to grow large single crystals.

A still further advantage of the present invention is that it provides a high temperature superconductor that is easily formable and manufacturable allowing it to be utilized in commercial applications.

Furthermore, an advantage of the present invention is that it provides a meltable high temperature superconductor to which other components can be added to make, for example, wire-type high temperature superconductors.

Still another advantage of the present invention is that it provides a high temperature superconductor having high critical currents.

Moreover, an advantage of the present invention is that it provides a high temperature superconductor that can be used to carry high currents without energy loss.

A further advantage of the present invention is that it provides a method for making high temperature superconductors.

A still further advantage of the present invention is that it provides a superconductor that can be utilized to levitate vehicles, store energy in magnetic fields, and produce more intense magnetic fields than heretofore possible.

Additional advantages and features of the present invention are described in, and will be apparent from, the detailed description of the presently preferred embodiments.

BRIEF DESCRIPTION OF THE DRAWINGS

FIG. 1 illustrates the electrical resistance of a resolidified Tb-Y-Ba-Cu-O melt.

DETAILED DESCRIPTION OF THE PRESENTLY PREFERRED EMBODIMENTS

The present invention provides a meltable, high temperature superconductor. As used herein, the term "high temperature" refers to a temperature above the boiling temperature of nitrogen. The present invention also provides a method of melting a high temperature superconductor.

It has been found that the meltable high temperature superconductor of the present invention upon resolidification, is superconducting with a critical temperature of at least 88° K. The meltable high temperature superconductor is based, to an extent, on the Tb-Ba-Cu-O system. The Tb-Ba-Cu-O system was investigated by groups at Bell Laboratories and at other laboratories including the University of Arkansas, but was found not to superconduct at high temperatures (equal to or above 77° K). Applicants have found that their inventive composition (including R) upon melting and resolidification has superconductor properties at high temperatures.

The meltable, high temperature superconductor composition of the present invention preferably has the formula:

Tb-R-Ba-Cu-O wherein:

R is chosen from the group of rare earth metals excluding: Praseodymium (Pr); Terbium (Tb); and Cerium (Ce).

Preferably, R is a rare earth metal chosen from the group consisting of: Yttrium (Y); Gadolinium (Gd); Erbium (Er) Holmium (Ho); Neodymium (Nd); Samarium (Sm); Europium (Eu); Ytterbium (Yb); Dysoprosium (Dy); Thulium (Tm); and Lutetium (Lu).

Most preferably, the meltable, high temperature superconductor has the following approximate stoichiometry:

$Tb_xR_yBa_vCu_3O_{6.5+z}$ wherein:

R is a rare earth metal excluding: Tb; Pr; and Ce.

V is greater than or equal to 2 and less than or equal to 2.6;

X is less than 0.8 and greater than 0.01.

Y is less than 1.8 and greater-than 0.8; and

Z is greater than or equal to 1.1 but less than or equal to 1.7.

In a preferred embodiment X is less than 0.8 and greater than or equal to 0.7.

By way of example and not limitation, examples of meltable, high temperature superconductor will now be given.

EXAMPLE 1:

A. The following reagents were utilized:
1. $Tb_4O_7$,
2. $Y_2O_3$,
3. $BaCO_3$, and
4. CuO.

B. The following procedure was followed:

1 Mixtures of $Tb_4O_7$, $Y_2O_3$, $BaCO_3$ and CuO powders with nominal compositions of $TbBa_2Cu_3O_{6.5}$ and $Y_{1.2}Ba_{0.8}CuO_{3.6}$ (hereafter Tb and $Y_{1.2}$, respectively) were ground in an agate mortar, packed in small quartz boats, and heated in air at 890–910° C. for 6–8 hours in a tube furnace.

2. The heated mixtures were powdered, and used for master materials.

3. Tb and $Y_{1.2}$ powders were then pressed separately into pellets having diameters of approximately ¼ and ½ inch, respectively.

4. A Tb pellet was then put on a $Y_{1.2}$ pellet in a quartz boat, and heated at 920–960° C. in flowing $O_2$ for 12–24 hours in a tube furnace, before furnace cooling to below 200° C. in about 1–2 hours.

Before this final heating process, the master pellet TB is brown and the master pellet $Y_{1.2}$ is green. After heating, the surface of the remaining Tb becomes gray, and the $Y_{1.2}$ remains green. Part of the Tb was melted into the $Y_{1.2}$ pellet and formed a black superconductive material. According to a weight balance experiment, if the Tb and $Y_{1.2}$ melted uniformly, this superconductor had a composition of $Tb_{.73}Y_{.98}Ba_{2.11}Cu_3O_{7.68}$. However, if the Tb and $Y_{1.2}$ did not melt uniformly, the resultant superconductive material would not have this stoichiometry.

This superconductive melt has an onset temperature of 103° K., and zero resistance at 85° K. FIG. 1 illustrates the electrical resistance of the resolidified Tb-Y-Ba-Cu-O melt. An onset temperature of 103° K. and zero-resistance at 85° K. is seen. These measurements were made at the University of Arkansas by the standard four-probe technique using a current of up to 100 mA with silver paste electrodes. The transition temperature, as specified by the midpoint of the 90% resistance and 10% resistance points in the transition region is 88° K.; the corresponding width of the transition is 5° K. Low frequency AC magnetic susceptibility measurements were performed at the University of Nebraska on a similar melt sample and showed a transition temperature at 89° K. Another similar melt sample was found at the University of Arkansas to levitate in a magnetic field when cooled to about 90° K. (Meissner effect). These measurements provide definitive evidence for high temperature superconductivity.

EXAMPLE 2

A. The following reagents were used:
1. $Tb_4O_7$
2. $Gd_2O_3$ (instead of the $Y_2O_3$ of Example 1)
3. $BaCO_3$
4. CuO B. The same procedure was followed as in Example 1 above except Y was substituted for by Gd. The resultant superconductive melt should have the following nominal composition if the Tb compound melts uniformly: $Tb_{.73}Gd_{.98}Ba_{2.11}Cu_3O_{7.68}$. The melt exhibited substantially identical properties to those exhibited by the melt of Example 1.

EXAMPLE 3

A. The following reagents were used:
1. $Tb_4O_7$
2. $Ho_2O_3$
3. $BaCO_3$
4. CuO B. The same procedure was followed as in Example 1 above except Y was substituted for by Ho. The resultant superconductive melt should have the following nominal composition if the Tb compound melts uniformly: $Tb_{.73}Ho_{.98}Ba_{2.11}Cu_3O_{7.68}$. The melt exhibited substantially identical properties to those exhibited by the melt of Example 1.

EXAMPLE 4

A. The following reagents were used:
1. $Tb_4O_7$
2. $Er_2O_3$
3. $BaCO_3$
4. CuO B. The same procedure was followed as in Example 1 above except Y was substituted for by Er. The resultant superconductive melt should have the following nominal composition if the Tb compound melts uniformly: $Tb_{.73}Er_{.98}Ba_{2.11}Cu_3O_{7.68}$. The melt exhibited substantially identical properties to those exhibited by the melt of Example 1.

EXAMPLE 5

A. The following reagents were used:
1. $Tb_4O_7$
2. $Y_2O_3$
3. $BaCO_3$
4. elemental Cu B. The same procedure was followed as in Example 1. The resultant superconductive melt should have the following nominal composition if the Tb compound melts uniformly: $Tb_{.73}Y_{.98}Ba_{2.11}Cu_3O_{7.68}$. The melt exhibited substantially identical properties to those exhibited by the melt of Example 1.

EXAMPLE 6

The same reagents as set forth in Example 1 and the same procedure was performed as set forth in Example 1 above. However, in this example, the melt Tb-Y-Ba-Cu-O formed a superconductive solder for pieces of the Y1.2 pellet with good mechanical strength. This superconductive-solder feature may be useful in bonding other high temperature ceramic superconductors of composition as yet undetermined.

EXAMPLE 7

The same reagents as in Example 1 were used and, likewise, the same procedure as was utilized in Example 1 was performed. Here the Tb-Y-Ba-Cu-0 formed a melted thick film superconductor on the Y1.2.

EXAMPLE 8

A. The following reagents were utilized:
1. $Tb_4O_7$,
2. $Y_2O_3$,
3. $BaCO_3$, and
4. CuO.

B. The following procedure was utilized:
1. Mixtures of $Tb_4O_7$, $Y_2O_3$, $BaCO_3$ and CuO powders with nominal compositions of $TbBa_2Cu_3O_{6.5}$ and $Y_{1.2}Ba_{0.8}CuO_{3.6}$ (hereafter TB and Y1.2, respectively) were ground in an agate mortar, packed in small quartz boats, and heated in air at 890-910° C. for 6-8 hours in a tube furnace.
2. The heated mixtures were powdered, and used for master materials.
3. TB powders were pressed separately into pellets having diameters of approximately ¼ inch.
4. A TB pellet was put on Y1.2 powder in a quartz boat, and heated at 920-960° C. in flowing $O_2$ for 12-24 hours in a tube furnace before, furnace cooling to below 200° C. in about 1-2 hours.

Before this final heating process, the master pellet Tb is brown and the master powder Y1.2 is green. After heating, the surface of remaining Tb becomes gray and Y1.2 remains green. Part of TB was melted into the Y1.2 powder and has formed a black superconductive material. According to a weight balance experiment, this superconductor should have the following nominal composition if the Tb compound melts uniformly:

$Tb_{.73}Y_{.98}Ba_{2.11}Cu_3O_{7.68}$.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A composition having superconductive properties comprising a melt produced complex having the nominal composition:

$$Tb_x - R_y - Ba_v - Cu_3 - O_{6.5+z}$$

wherein:
R is chosen from the group consisting of the rare earth metals exluding: Praseodymium, Terbium; and Cerium;
V has a value that is greater than or equal to 2 and less than or equal to 2.6;
X has a value that is greater than 0.01 and less than 0.8;
Y has a value that is greater than 0.8 and less than 1.8; and
Z has a value that is greater than or equal to 1.1 and less than or equal to 1.7.

2. The composition of claim 1 wherein R is Erbium.

3. The composition of claim 1 wherein R is Holmium.

4. The composition of claim 1 wherein R Gadolinium.

5. The composition of claim 1 wherein R yttrium.

6. The composition having superconductive properties comprising the formula:

$$Tb_x - R_y - Ba_v - Cu_3 - O_{6.5+z}$$

wherein:
R is chosen from the group consisting of the rare earth metals exluding: Praseudymium, Terbium; and Cerium;
V has a value that is greater than or equal to 2 and less than or equal to 2.6,
X has a value that is greater than 0.01 and less than 0.8;
Y has a value that is greater than 0.8 and less than 1.8; and
Z has a value that is greater than or equal to 1.1 and less than or equal to 1.7.

7. The composition of claim 6 wherein R is chosen form the group consisting of: Yttrium; Ytterbium; Gadolinium; Erbium; Holmium; Neodymium; Samarium; Europium; Dysprosium; Thulium; and Lutetium.

8. A meltable, high temperature superconductor composition having the formula:

$$Tb_x - R_y - Ba_v - Cu_3 - O_{6.5+x}$$

wherein:
R is chosen from the group consisting of the rare earth metals excluding: praseudymium; terbium; and cerium;
V has a value that is greater than or equal to 2 and less than or equal to 2.6;
Y has a value that is greater than 0.8 and less than 1.8;

Z has a value that is greater than or equal to 1.1 and less than or equal to 1.7; and X has a value that is greater than or equal to 0.7 and less than 0.8.

9. The composition of claim 6 wherein R is Erbium.

10. The composition of claim 6 wherein R is Holmium.

11. The composition of claim 8 wherein R is Yttrium.

12. The meltable, high temperature superconductor of claim 8 wherein R is chosen form the group consisting of: Yttrium; Ytterbium; Gadolinium; Erbium; Holmium; Neodymium; Samarium; Europium; Dysprosium; Thulium; and Lutetium.

13. The meltable, high temperature superconductor of claim 8 wherein R is Erbium.

14. The meltable, high temperature superconductor of claim 8 wherein R is Holmium.

15. The meltable, high temperature superconductor of claim 8 wherein R is Yttrium.

16. A composition having superconductive properties having the following approximate stoichiometry:

$$Tb_{.73}Y_{.98}Ba_{2.11}Cu_3O_{7.8}.$$

17. A composition having superconductive properties having the following approximate stoichiometry:

$$Tb_{.73}Gd_{.98}Ba_{2.11}Cu_3O_{7.8}.$$

18. A composition having superconductive properties having the following approximate stoichiometry:

$$Tb_{.73}Ho_{.98}Ba_{2.11}Cu_3O_{7.8}.$$

19. A composition having superconductive properties having the following approximate stoichiometry:

$$Tb_{.73}Er_{.98}Ba_{2.11}Cu_3O_{7.68}.$$

20. A composition having superconductive properties having the formula:

$$Tb_x-Y_s-Ba_v-Cu_3-O_{6.5+z}$$

wherein:

V has a value that is greater than or equal to 2 and less than or equal to 2.6;

X has a value that is greater than 0.01 and less than 0.8;

S has a value that is greater than 0.8 and less than 1.8; and

Z has a value that is greater than or equal to 1.1 and less than or equal to 1.7.

21. A method for making a high temperature superconductor comprising the steps of:
(a) grinding together mixtures of Tb$_4$O$_7$, Y$_2$O$_3$, BaCO$_3$, and CuO to form powders of nominal composition TbBa$_2$Cu$_3$O$_{6.5}$ and Y$_{1.2}$Ba$_{0.8}$CuO$_{3.6}$;
(b) heating the TbBa$_2$Cu$_3$O$_{6.5}$ and Y$_{1.2}$Ba$_{0.8}$CuO$_{3.6}$ powders separately in air at 890–910° C. for 6–8 hours;
(c) regrinding and pelletizing the TbBa$_2$Cu$_3$O$_{6.5}$ and Y$_{1.2}$Ba$_{0.8}$CuO$_{3.6}$ powders separately;
(d) heating the TbBa$_2$Cu$_3$O$_{6.5}$ pellet on top of the Y$_{1.2}$Ba$_{0.8}$CuO$_{3.6}$ pellet in flowing O$_2$ at 920–960° C. for 12–24 hours; and
(e) removing the resolidified melt portion which is a high temperature superconductor.

22. A method for making a high temperature superconductor comprising the steps of:
(a) grinding together mixtures of Tb$_4$O$_7$, Y$_2$O$_3$, BaCO$_3$, and CuO to form powders of nominal composition TbBa$_2$Cu$_3$O$_{6.5}$ and Y$_{1.2}$Ba$_{0.8}$CuO$_{3.6}$;
(b) heating the TbBa$_2$Cu$_3$O$_{6.5}$ and Y$_{1.2}$Ba$_{0.8}$CuO$_{3.6}$ powders separately in air at 890–910° C. for 6–8 hours;
(c) pelletizing the TbBa$_2$Cu$_3$O$_{6.5}$ pellet on top of the Y$_{1.2}$Ba$_{0.8}$CuO$_{3.6}$ powder in flowing O$_2$ at 920–960° C. for 12–24 hours; and
(e) removing the resolidified melt portion which is a high temperature superconductor.

23. A method for making a high temperature superconductor comprising the steps of:
(a) grinding together mixtures of Tb$_4$O$_7$m, Gd$_2$O$_3$, BaCO$_3$, and CuO to form powders of nominal composition TbBa$_2$Cu$_3$O$_{6.5}$ and Gd$_{1.2}$Ba$_{0.8}$CuO$_{3.6}$;
(b) heating the TbBa$_2$Cu$_3$O$_{6.5}$ and Gd$_{1.2}$Ba$_{0.8}$CuO$_{3.6}$ powders separately in air at approximately 890 to about 910° C. for approximately 6 to about 8 hours;
(c) regrinding and pelletizing the TbBa$_2$Cu$_3$O$_{6.5}$ and Gd$_{1.2}$Ba$_{0.8}$CuO$_{3.6}$ powders separately;
(d) heating the TbBa$_2$Cu$_3$O$_{6.5}$ pellet on top of the Gd$_{1.2}$Ba$_{0.8}$CuO$_{3.6}$ pellet in flowing O$_2$ at approximately 920 to about 960° C. for approximately 12 to about 24 hours; and
(e) removing the resolidified melt portion which is a high temperature superconductor.

24. A method for making a high temperature superconductor comprising the steps of:
(a) grinding together mixtures of Tb$_4$O$_7$, Ho$_2$O$_3$, BaCO$_3$, and CuO to form powders of nominal composition TbBa$_2$Cu$_3$O$_{6.5}$ and Ho$_{1.2}$Ba$_{0.8}$CuO$_{3.6}$;
(b) heating the TbBa$_2$Cu$_3$O$_{6.5}$ and Ho$_{1.2}$Ba$_{0.8}$CuO$_{3.6}$ powders separately in air at approximately 890 to about 910° C. for approximately 6 to about 8 hours.
(c) regrinding and pelletizing the TbBa$_2$Cu$_3$O$_{6.5}$ and Ho$_{1.2}$Ba$_{0.8}$CuO$_{3.6}$ powders separately;
(d) heating the TbBa$_2$Cu$_3$O$_{6.5}$ pellet on top of the Ho$_{1.2}$Ba$_{0.8}$CuO$_{3.6}$ pellet in flowing O$_2$ at approximately 920 to about 960° C. for approximately 12 to about 24 hours; and
(e) removing the resolidified melt portion which is a high temperature superconductor.

25. A method for making a high temperature superconductor comprising the steps of:
(a) grinding together mixtures of Tb$_4$O$_7$, Er$_2$O$_3$, BaCO$_3$, and CuO to form powders of nominal composition TbBa$_2$Cu$_3$O$_{6.5}$ and Er$_{1.2}$Ba$_{0.8}$CuO$_{3.6}$;
(b) heating the TbBa$_2$Cu$_3$O$_{6.5}$ and Er$_{1.2}$Ba$_{0.8}$CuO$_{3.6}$ powders separately in air at approximately 890 to about 910° C. for approximately 6 to about 8 hours.
(c) regrinding and pelletizing the TbBa$_2$Cu$_3$O$_{6.5}$ and Er$_{1.2}$Ba$_{0.8}$CuO$_{3.6}$ powders separately;
(d) heating the TbBa$_2$Cu$_3$O$_{6.5}$ pellet on top of the Er$_{1.2}$Ba$_{0.8}$CuO$_{3.6}$ pellet in flowing O$_2$ at approximately 920 to about 960° C. for approximately 12 to about 24 hours; and
(e) removing the resolidified melt portion which is a high temperature superconductor.

26. A method for making a high temperature superconductor comprising the steps of:
(a) grinding together mixtures of Tb$_4$O$_7$, Y$_2$O$_3$, BaCO$_3$, and elemental Cu to form powders of nominal composition TbBa$_2$Cu$_3$O$_{6.5}$ and Y$_{1.2}$Ba$_{0.8}$CuO$_{3.6}$;

(b) heating the TbBa$_2$Cu$_3$O$_{6.5}$ and Y$_{1.2}$Ba$_{0.8}$CuO$_{3.6}$ powders separately in air at approximately 890 to about 910° C. for approximately 6 to about 8 hours;

(c) regrinding and pelletizing the TbBa$_2$Cu$_3$O$_{6.5}$ and Y$_{1.2}$Ba$_{0.8}$CuO$_{3.6}$ powders separately;

(d) heating the TbBa$_2$Cu$_3$O$_{6.5}$ pellet on top of the Y$_{1.2}$Ba$_{0.8}$CuO$_{3.6}$ pellet in flowing O$_2$ at approximately 920 to about 960° C. for approximately 12 to about 24 hours; and (e) removing the resolidified melt portion which is a high temperature superconductor.

* * * * *